United States Patent [19]
Wood et al.

[11] Patent Number: 5,471,509
[45] Date of Patent: Nov. 28, 1995

[54] UNIVERSAL MATCHED FILTER

[75] Inventors: Steven L. Wood; Manuel L. Garcia, both of San Diego, Calif.

[73] Assignee: TRW Inc., Redondo Beach, Calif.

[21] Appl. No.: 33,717

[22] Filed: Mar. 18, 1993

[51] Int. Cl.⁶ .............................. H04B 1/10; H04B 17/02
[52] U.S. Cl. .................... 375/350; 455/133; 364/424.01; 364/423; 364/449
[58] Field of Search .............................. 375/94, 99, 103; 455/142, 143, 144; 364/449, 459, 423, 424.06, 424.01, 180

[56] References Cited

U.S. PATENT DOCUMENTS 3,665,507  5/1972  Peil .......................................... 455/144
4,835,792  5/1989  Davarian .................................. 455/142

*Primary Examiner*—Stephen Chin
*Assistant Examiner*—William Luther

[57] ABSTRACT

A universal matched filter integrates previously individualized communication hardware in an avionic suite into a single piece of digital hardware. Characterization of the individual processing functions required within an avionic system such that they lend themselves to common hardware processing allows the avionic suite to be designed with a minimum set of circuit elements, each which may be used for more than one communication mode.

15 Claims, 5 Drawing Sheets

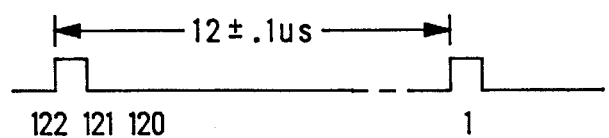
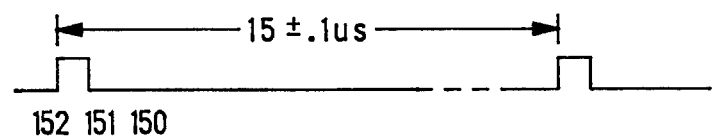
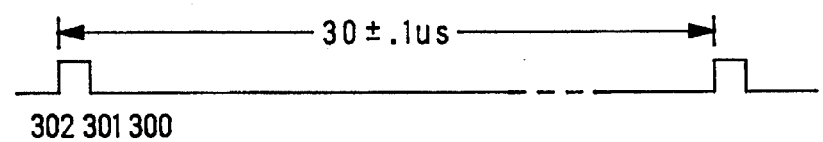
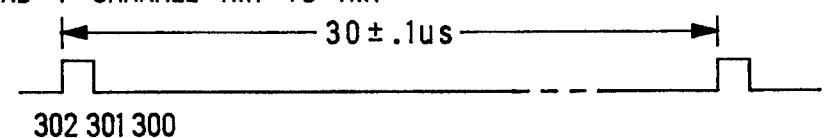
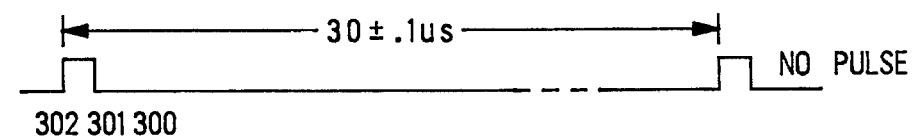
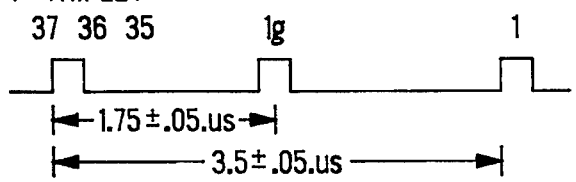
Fig-3
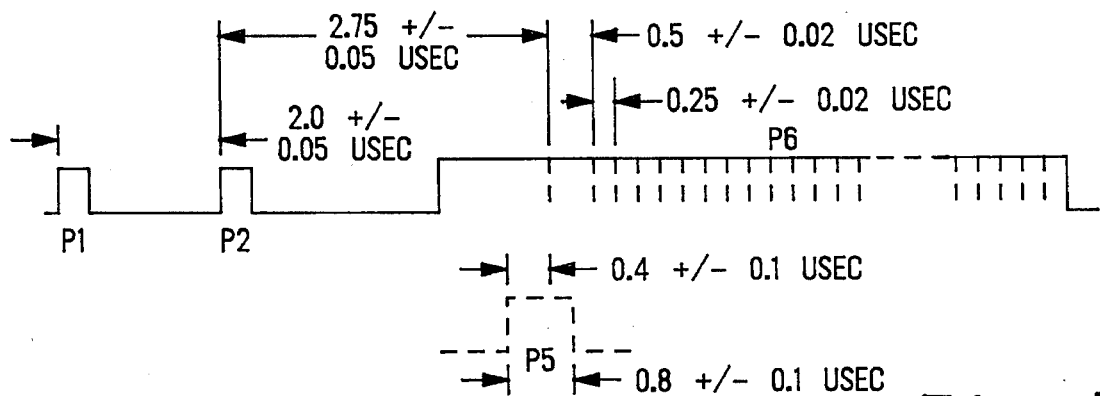
Fig-5

THE PULSE SHAPES FOR PAM INTERROGATIONS ARE SUMMARIZED BELOW:
(ALL VALUES ARE IN MICROSECONDS)

| PULSE DESIGNATOR | PULSE DURATION | DURATION TOLERANCE | RISE TIME MIN/MAX | DECAY TIME MIN/MAX |
|---|---|---|---|---|
| P1,P2,P3,P5 | 0.8 | +/- 0.1 | 0.05/0.1 | 0.05/0.1 |
| P4 (LONG) | 1.6 | +/- 0.1 | 0.05/0.1 | 0.05/0.1 |

THE PULSE SHAPES FOR PAM INTERROGATIONS ARE SUMMARIZED BELOW:
(ALL VALUES ARE IN MICROSECONDS)

| INTERROGATION TYPE | SPACING | | | |
|---|---|---|---|---|
| | P1-P2 | P1-P3 | P1-P4 | P4 |
| ATCRBS MODE A | 2+/-0.15 | 8+/-0.2 | – | NONE |
| ATCRBS MODE C | 2+/-0.15 | 21+/-0.2 | – | NONE |
| ATCRBS MODE A/MODE S ALL-CALL | 2+/-0.15 | 8+/-0.2 | 2+/-0.05 | LONG |
| ATCRBS MODE C/MODE S ALL-CALL | 2+/-0.15 | 21+/-0.2 | 2+/-0.05 | LONG |

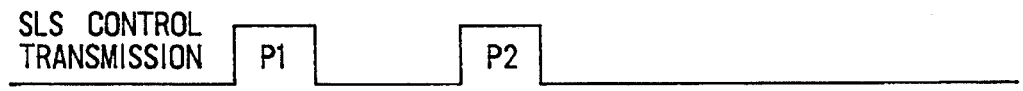

GENERAL PULSE PATTERNS FOR PAM INTERROGATIONS

RELATIVE PULSE AMPLITUDES

P2 AMPLITUDES WILL VARY FROM P1
P3 AMPLITUDES ARE P1 +/- 1 dB
P4 AMPLITUDES ARE P4 +/- 1 dB

Fig-4

UNIVERSAL MATCHED FILTER

The subject matter of this invention was conceived under Government Contract No. F33615-83-C-1001, Department of Defense.

BACKGROUND OF THE INVENTION

1. Technical Field

This invention relates generally to avionic electronics and, more particularly, to an avionic communication system which integrates previously individualized communications components by allowing the detection of several avionic communication waveforms with a single article of digital hardware.

2. Discussion

The current configuration of avionic suites, or the electronics of the airplane, is that of single function articles of communications hardware, each individually designed to perform a single processing function such as navigation, friend/foe identification or voice communications. A main reason for utilizing a separate piece of hardware for each of these functions is that they are each performed using a different signal type having unique characteristics. For instance, signals such as those used to identify an aircraft as a friend or foe are pulsed sinusoids. In contrast, spread spectrum signals used for communication systems and for navigation are transmitted and received as PSK (Phase Shift Key) or FSK (Frequency Shift Key) modulated signals.

The modes of operation of interest in an exemplary military avionics system may include the following:

Mark XII Transponder and Mark XII Interrogator

TACAN (Tactical Air Communication And Navigation)

Mode S Transponder

AN/ARC-164, AN/ARC-186, AN/ARC-199

VOR, ILS, MLS

PLRS EPUU (Precision Location Report System, Enhanced Precision Location Report System User Unit)

T-JTIDS (Time Division Multiple Access-Joint Tactical Information Distribution System)

GPS (Global Positioning System)

The Mark XII Transponder mode allows an aircraft to receive interrogation waveforms made up of sequences of pulsed sinusoids from a Mark XII Interrogator. There are five modes of interrogation possible, commonly known as modes 1, 2, 3/A, C and 4. Each of these modes is represented by its own specific pattern of pulsed sinusoids as shown graphically in FIG. 1. The Mark XII Interrogator mode allows an aircraft to receive reply waveforms in response to previously transmitted pulsed sinusoid interrogations which are also made up of a sequence of pulsed sinusoids. There are two basic formats for the allowed pulsed sinusoid replies as shown graphically in FIG. 2. TACAN is a mode which allows navigation information to be obtained or supplied by an aircraft. This mode is likewise represented by patterns of pulsed sinusoids as shown in FIGS. 1 and 3.

The Mode S Transponder mode allows an aircraft to receive ATCRBS 3A and C interrogations, ATCRBS/Mode S All-Call interrogations and Mode S Interrogations. The first two of these types of interrogations are patterns of pulsed sinusoids as shown in FIG. 4. The third, Mode S, is a pulsed sinusoid pattern preamble followed by a DPSK (Differential Phase Shift Key) waveform containing the interrogation message, as illustrated by FIG. 5.

Various others of these modes are for signals in the UHF and VHF frequency range. The AN/ARC-164 mode allows an aircraft to receive a UHF AM signal and the AN/ARC-186 mode allows an aircraft to receive VHF AM or FM signals. The AN/ARC-199 mode allows an aircraft to receive HF AM or FM signals. VOR, ILS and MLS modes, used by aircraft as navigation and landing aides, allow an aircraft to receive various combinations of VHF and UHF signals that have relative navigation information modulated in either amplitude or frequency.

PLRS EPUU and T-JTIDS modes are used by an aircraft to receive and send tactical information to other aircraft on the same network. The information transferred in these modes is contained within MSK (Minimum Shift Key) modulated signals.

It is evident from the description of these various representative modes of interest that, in the past, as these modes were introduced, an existing radio could not process them due to an inherent lack of reconfiguration in a totally hardware implemented radio. Therefore, due to vast differences in these signal types, different receiver electronics were necessary for each.

However, the size, weight, performance, reliability and maintainability of each of these individual pieces of hardware has become very critical, especially in military applications. The need for individual hardware elements for the various avionic modes makes redundancy for fault tolerance and the provision of backup equipment almost impossible. Furthermore, enhancements must be provided individually to each article of hardware, making them both difficult and expensive. Existing avionic systems, made up of these various individual elements, have to be configured manually and therefore have low reliability with high maintainability.

It would, therefore, be desirable to integrate these various single function components into a multiple function single article of hardware in order to reduce hardware costs as well as the weight and size of the avionic suite. Integration of such system components would also facilitate redundancy and system enhancements.

SUMMARY OF THE INVENTION

By characterizing the individual processing functions required within an avionic system such that they lend themselves to common hardware processing, the avionic suite can be designed with a minimum set of circuit elements which may each be used for more than one mode. This substantially adds to the maintainability, reliability and flexibility of the avionic system as well as improves the ability to reconfigure the system.

The present invention provides a universal matched filter (UMF) which integrates previously individualized communications processing components by allowing the detection of several avionic communication signal types with a single article of digital hardware. Waveforms corresponding to a desired mode are detected and demodulated, the information contained therein being passed on for further processing to other elements of the system. All other received signals are inhibited or "filtered" out.

Additional objects, advantages and features of the present invention will become apparent to one skilled in the art upon review of the following description and appended claims, taken in conjunction with the accompanying drawings.

BRIEF DESCRIPTION OF THE DRAWINGS

FIG. 3 is a graphical representation of the pulsed sinusoids of the Mode 4 and TACAN modes.

FIGS. 4 and 5 illustrate the signals of Mode S Transpond and Interrogation modes.

DESCRIPTION OF A PREFERRED EMBODIMENT

Figure 1:
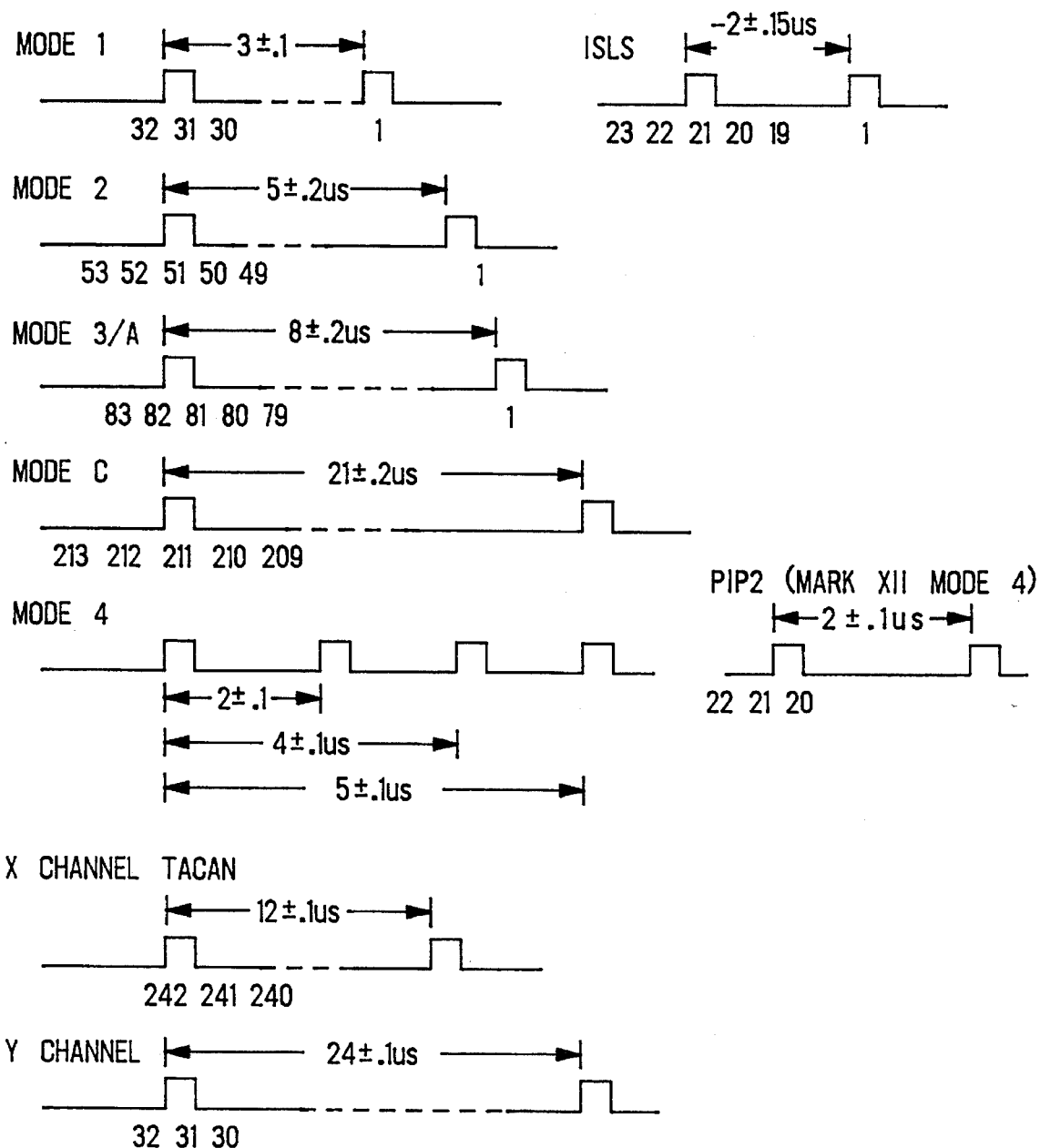
FIG. 1 illustrates a graphically pulsed sinusoid signals of the Mark XII Transponder and TACAN modes.
Figure 2:
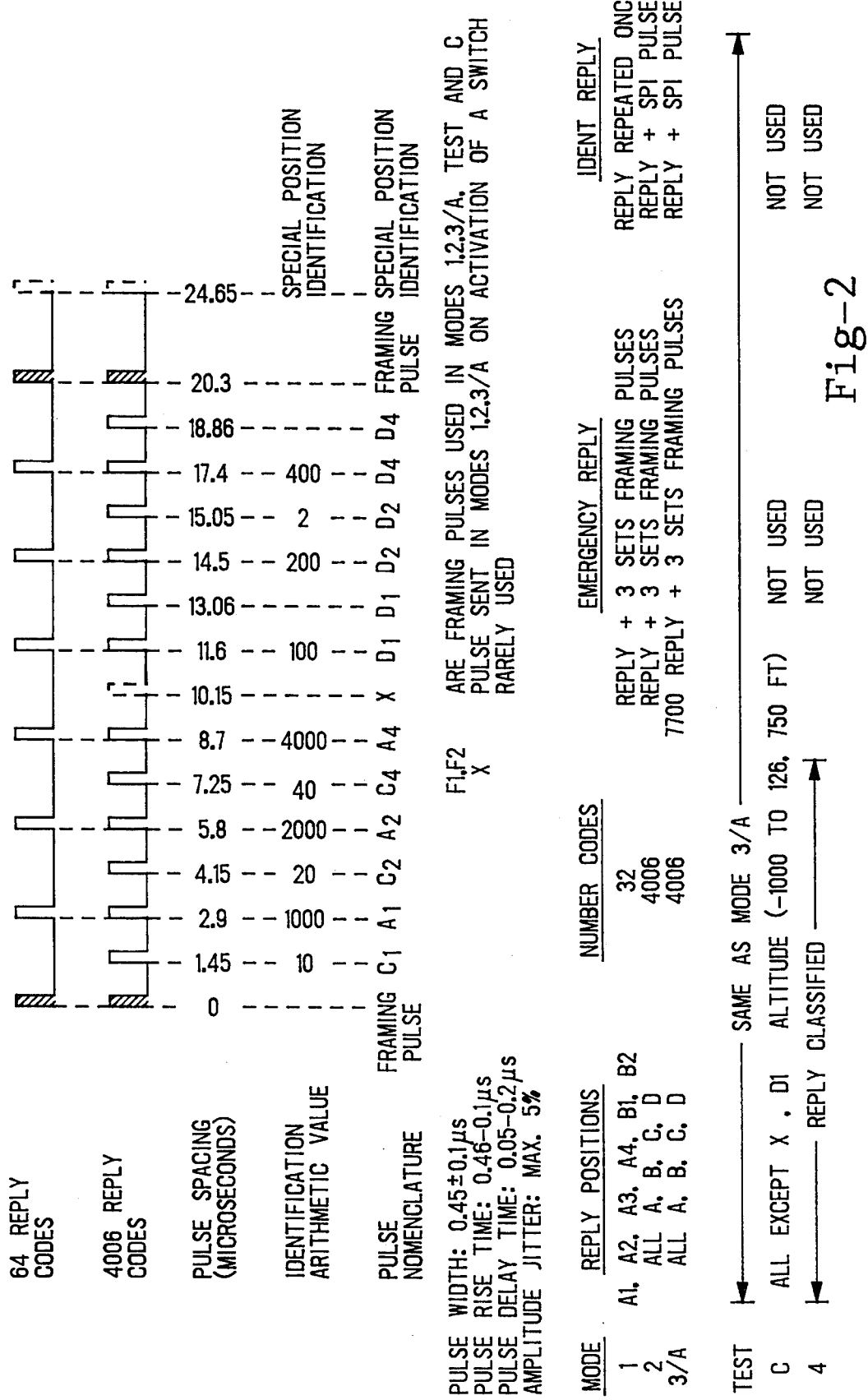
FIG. 2 is a graphical representation of the pulsed sinusoid signals of the Mark XII Interrogator mode.
Figure 6:
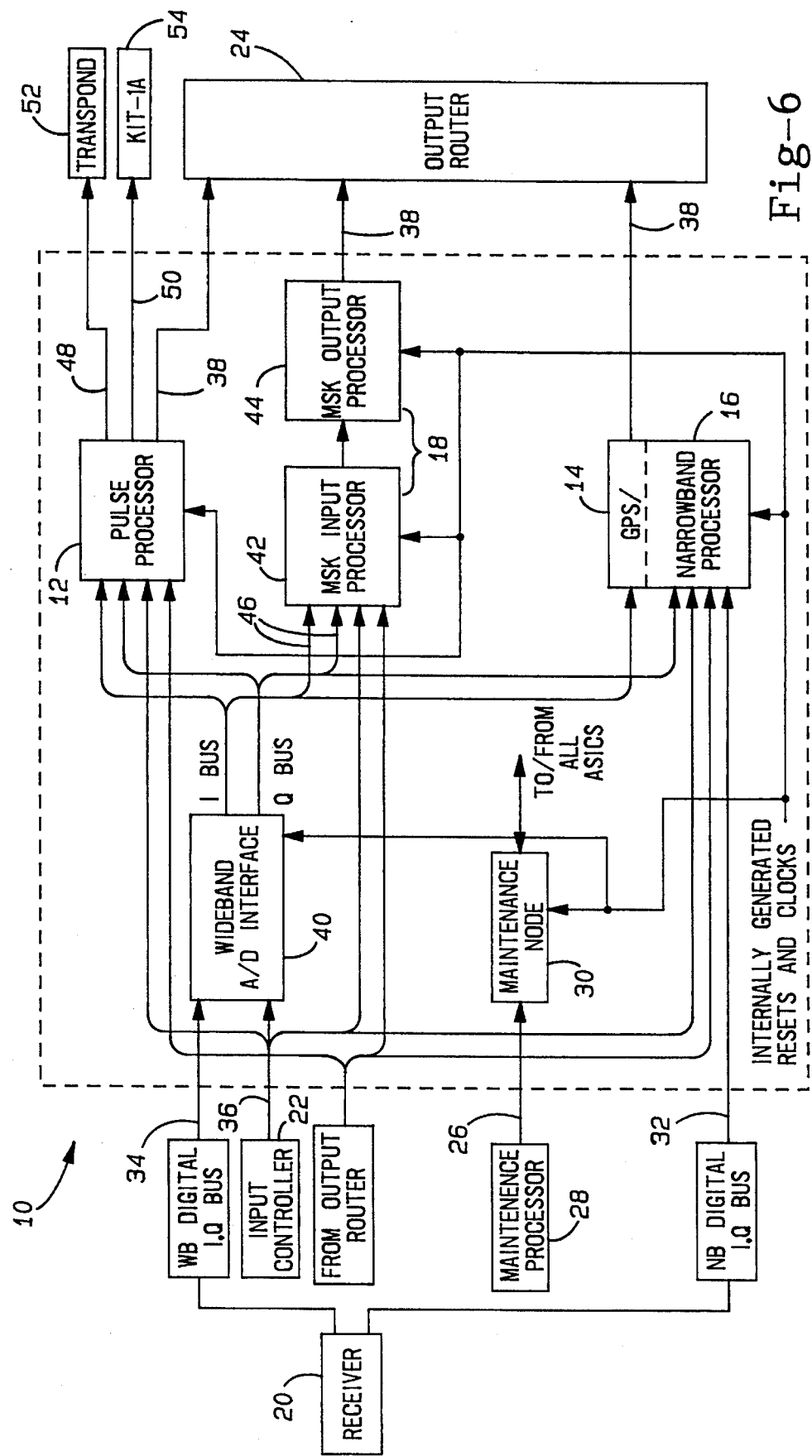
FIG. 6 is a block diagram of the main system components of the universal matched filter of the present invention.

Referring now to FIG. 6, the universal matched filter (UMF) according to the teachings of the present invention is indicated generally at 10. UMF 10 is preferably implemented in hardware as a single card and comprises four main functional processing components, each preferably implemented as an ASIC (Application Specific Integrated Circuit) or a group of ASICs. These main functional components are the pulse processor 12, GPS (Global Positioning System) processor 14, narrowband processor 16 and MSK (Minimum Shift Keying) processor 18. As shown by FIG. 6, MSK processor 18 may require more than one ASIC and the GPS processor 14 and narrowband processor 16 are preferably implemented as a single ASIC.

UMF 10, through use of these processors, a front end receiver 20, an Input Controller (IC) 22 and an Output Router 24, supports four generic operational modes: (1) Pulse processing, (2) Global Positioning System (GPS) processing, (3) Narrowband processing, and (4) MSK processing. Each of these UMF processor module functions (pulse, narrowband, GPS and MSK) has its own dedicated input and output requirements. The system is preferably configured such that it is possible to run the narrowband processing function at any time through a narrowband I and Q bus 32 connected to the narrowband processor 16, but the other three modes of operation are mutually exclusive.

An incoming signal, or a collection of many signals present in the atmosphere, is received by the front end receiver 20 which downconverts, demodulates and digitizes the signal as well as converts it into its inphase and quadrature (90 degrees out of phase), or I and Q, components when appropriate. The UMF processor 10 receives these signals through the narrowband I and Q bus 32 and a wideband I and Q bus 34 along with operational configuration commands and execution parameters from the IC 22 through an Input Controller (IC) bus interface 36. UMF processor 10 provides processed results to an associated controller module and provides clock and configuration commands to and receives digitized samples from wideband and narrow band A/D converter modules. The Input Controller (IC) bus interface 36 allows the IC 22 to communicate with UMF processor module 10. This communication mainly consists of configuration parameters and control signals sent by the IC 22. An Output Router (OR) interface 38 on UMF processor 10 provides an output data path from the processing functions resident on the UMF processing module 10. This OR interface 38 preferably consists of sixteen tristate output interconnects for data, five input interconnects for address, and various discrete function selects based upon the signal characteristics. The output router interface 38 supports and generates the required handshake and bus protocol with the output router 24. The output router interface 38 sends out a data block ready signal which indicates that a particular output message is available. It then receives an address and port enable signal, which it decodes and then sends to the output router 24.

A wideband A/D interface gate array 40 has the following subfunctions: input controller interface, input data router, odd and even separator and output data router. These subfunctions enable data from the A/D interface module 40 to be interfaced with the UMF 10. Data is input, altered and output from the A/D interface gate array 40 in a way that will reflect the current mode (pulse, DPSK, GPS, and MSK). The input controller interface 36 allows the input controller 22 to communicate with the A/D interface gate array 40. The pulse processor input interface receives control bits used to multiplex the data sets from the ND interface module 40. The input controller interface 36 receives control, address and data signals from the input controller 22 and provides certain bits which make the A/D interface gate array 40 function in the desired mode.

One of the four above-described modes is selected based upon the type of information and therefore the type of signal desired to be acquired. The desired mode is set by downloading configuration data and a start time, known to those skilled in the art as the time of effectivity, to UMF processing module 10 from the IC 22 through input controller interface 36. When the selected processor block 12–18 is enabled based upon the desired mode, it searches for patterns in the received signal corresponding to those of the desired signal type. Based upon those patterns it synchronizes with the signal and gathers data. To minimize traffic, only data corresponding to the desired signal type is sent on for further processing, the remaining signals being inhibited, thus characterization of the present invention as a "filter". This feature is particularly important as there exists a great deal of noise in the atmosphere as well as numerous other intefering signals.

A maintenance bus interface 26 allows maintenance protocol processor 28 to interface and communicate with a maintenance node 30 on UMF processor module 10 to provide directed built-in test capability for the ASIC components of UMF 10.

Data to be processed is received from the wideband analog-to-digital (A/D) interface gate array 40. This data is processed by the appropriate subfunction, dependent on the current operating mode. Commands which direct the operation of the processor array are received from the serial input controller interface bus 36. The input controller interface 36 interprets all applicable commands and directs the operation of each subfunction within the ASIC. Typical control operations include placing subfunctions into the desired system operating mode, writing initialization data into a particular subfunction, and updating subfunction parameters.

The MSK processor 18 has an MSK input processor 42 and a MSK output processor 44 which performs preparatory processing for the high rate baseband portions of the receive algorithms for the T-JTIDS and EPUU Systems. These systems are similar in that both use five MCPS (million chips per second) MSK modulation. The MSK input 42 ASIC has two 2-bit input data ports 46 representing two bits of amplitude for the inphase and quadrature samples.

MSK processor 18 is capable of operating in any one of several modes which includes J-TIDS acquisition, CCSK demodulation, EPUU acquisition, and EPUU demodulation. Therefore, the MSK input chip 42 processing function preferably includes the following functional elements: PN (pseudo random noise) code wipeoff subfunction, EPUU demodulator, Wedge delays, Correlator bank, CCSK (Circular Code Shift Key) demodulator, acquisition processor, and MSK slice controller. Input data samples are preferably processed as two 2-bit words representing an Inphase and Quadrature complex pair. The MSK input 42 ASIC prepares the sampled data for demodulation in the MSK output 44 ASIC. An IC Interface (ICI) receives instructions and data such as correlator configuration, PN sequences, CCSK codes, time of effectivity and other data from the IC 22.

The PN wipeoff function performs a biphase PN despread operation on the inphase (I-rail) and quadrature (Q-rail). The EPUU demodulator has as an input the data output of the PN wipeoff function. The PN wipeoff function removes PN coding that has been placed on the signal before transmission. After A/D sampling of the received signal, the inphase and quadrature components are MSK demodulated via an Amoroso rotation method and sent to the PN wipeoff. To remove the PN sequence, the inphase and quadrature components are exclusive ORed with an internally generated PN sequence. The wedge delays provide capability to delay the output of the PN wipe off function by four independent amounts for aligning pulses used in T-JTIDS and EPUU preamble detection. The EPUU demodulator function, when enabled, performs a complex integrate and dump over consecutive blocks of nineteen samples. Each integration result is made available to the output router 24.

The reconfigurable correlator bank contains the following subfunctions: (1) four length 32 complex correlators, (2) correlation summation tree, and (3) correlation data source selection. Each of four length 32 complex correlators receive as data input two 2-bit data rails, inphase and quadrature, and correlate them against a length 32 hard limited reference which has been previously word serially loaded into each correlator via the IC bus interface 36. Each correlator provides an inphase and quadrature correlation output. The complex correlation outputs are also combined to form a correlation envelope. This envelope is compared against a threshold. When the threshold is exceeded, an indication of this event and the accompanying time of day is made available to the output router 24.

The pulse processor 12 has 11 pulse processor CNI subfunctions: Diversity Processor, Differential Phase Shift Keyed Demodulator, Input Controller Interface, Jammer Detector, KIT-1A detector, Output Router Interface, Pulse Detector, Pulse Position Demodulator, RSLS Processor, Time Of Day Generator, and Transpond Processor Interface. Under control from IC 22 via the Input Controller Interface 36, the pulse processor 12 is capable of operating in various system modes which include Mark XII Transpond, Mark XII Interrogator, TACAN Transpond, TACAN Interrogator and ATCRBS/Mode S Transpond. A/D data which is to be processed is received from the A/D Interface Gate Array 40. This data is processed by the appropriate subfunction depending on the current operating mode.

Commands and data which direct the operation of the pulse processor 12 gate array are received from the input controller interface bus 36. An input controller interface subfunction interprets all applicable commands and directs the operations including placing subfunctions into the desired system operating mode, writing initialization data into a particular subfunction, and updating subfunction parameters.

Within pulse processor 12, the received digitized I and Q samples are received and combined to form an approximation of the envelope of the incoming signal. This envelope is received by pulse detection, diversity processing and RSLS processing subfunctions. The pulse detection subfunction compares the incoming envelope samples with a programmable threshold. When the samples exceed the threshold, a pulse is said to be detected. If the envelope magnitude remains above the threshold value for a programmable number of samples the pulse is said to have met the minimum pulse width criteria. If the envelope magnitude remains above the threshold value for less than a programmable number of additional samples, the pulse is said to have met the maximum pulse width criteria, the valid pulse indication is deleted. Otherwise, the valid pulse indication is passed onto the diversity processor subfunction. Note that there are two pulse detection subfunctions used for Mark XII modes 1, 2, 3/A and C processing and two pulse detection subfunctions used for Mark X II mode 4. One of the pulse detection subfunctions for each of the modes receives envelope signals generated from waveforms received by an upper antenna of the aircraft while the other pulse detection subfunction, for each mode, receives envelope signals generated from waveforms received by a lower antenna of the aircraft.

The diversity processor subfunction uses envelope samples from the upper and lower antennas that are delayed sufficiently to align them with corresponding indications of valid pulses. When an indication of a valid pulse is received by the diversity processor from either or both of the upper and lower antenna pulse detectors, it decides which antenna is supplying valid data. If both antennas are supplying valid data, the diversity processor picks the antenna supplying the largest magnitude pulse as the valid pulse. The diversity processor then commands the transmitting antenna to select either the upper or lower antenna to supply any corresponding reply. Note that this subfunction is used only when the aircraft is operating as a transponder and is being interrogated. In addition, the binary indication corresponding to the pulse selected as valid is sent onto the pulse position demodulator.

The pulse position demodulator is programmable to allow the detection of the various pulse patterns of interest corresponding to the pulsed modes mentioned above. The pulse position demodulator receives a valid pulse indication from the pulse detector as a binary one and time a valid pulse is detected. These binary ones are separated by binary zeros for each sample where a valid pulse detection does not occur. Therefore, the pulse position demodulator receives a serial stream of binary ones and zeroes representing uniform in time declarations of a pulse being valid. When a stream of binary bits in the pulse position demodulator contains binary ones separated by the programmable required amounts of time, including tolerances, the required pattern is said to be detected. Depending upon the mode of operation requested, the pulse position demodulator will either generate an appropriate transpond command pulse to the transpond interface or extract data and make it available to the output router interface 38 which will pass it on to the output router 24.

The jammer detector receives a binary signal from each of the pulse detectors which, when high, indicates that a pulse is present at the input to the corresponding pulse detector. By use of this signal, the jammer detector can detect possible pulsed or continuous wave jammers. In searching for potential CW jammers, the jammer detector reports to the output router 24 the accumulated on-time of a pulse exceeding 50 microseconds. This is done at a programmable rate. In searching for pulsed jammers, the jammer detector counts the number of low to high transitions on the signal being monitored. It supplies this count at a programmable rate.

The RSLS processor is used by an aircraft to discriminate between valid and invalid replies. Valid replies are those that are received in the interrogating aircraft's antenna main lobe. These replies are of greater magnitude in the sum channel signals from the receiver. Invalid replies are those that are received in the interrogating aircraft's antenna sidelobe. These replies are of greater magnitude in the delta channel signals from the receiver. The RSLS processor compares the sum and delta channel samples for each valid pulse received in Mark XII Interrogator mode. If the sum channel samples are of greater magnitude, the corresponding valid pulse indication is allowed to pass to the pulse position demodulator. If the delta channel samples are of greater magnitude, the corresponding valid pulse indication is suppress.

The DPSK signal demodulator subfunction receives inphase and quadrature samples from the Wideband A/D Interface 40 ASIC and uses these to demodulate interrogations received in differential phase shift keyed format. Such interrogations are led by a pulse position modulated preamble. Once the preamble is detected, with the pulse processor operating in Mode S, the DPSK interrogations is demodulated and the resultant bit stream is unscrambled and the interrogations information is used to decide if the interrogation was meant for the receiving aircraft. If it is, this subfunction transfers other pertinent interrogation data to the output router via 24 the output router interface 38.

A transpond processor interface 48, KIT-1A interface 50 and output router interface 38 allow the pulse processor 12 to output its processing results to other external avionics functions such as the transpond processor 52, KIT-1A 54 and output router, 24 respectively. A time of day generator subfunction allows the pulse processor 12 to start processing modes at precise times and time-tag incoming data.

The GPS processing 14 function performs high rate base band portions of the GPS 14 receive algorithm. The GPS and narrowband 16 processing functions are preferably implemented on a single chip. This chip contains one GPS processor 14 and one narrowband processor 16 arranged in individual entities with the exception of a limited amount of shared interfaces and logic. Characteristics of the received waveform which drive the design of this function follow. From each satellite source, one unique code pair out of a possible 37 are transmitted in quadrature. Both code rails are biphase modulated with the same 50 Hz data sequence which is constrained to have bit boundaries in synchronism with the one millisecond C/A code and one week P code epochs. Due to relative motion and local oscillator offsets, the downconverted waveform can have both a residual frequency offset and/or Doppler effects which must be compensated for.

The GPS 14 function contains a local GPS PN generator and numerically controlled oscillators (NCOs) for fine frequency and phase correction of the local PN code relative to the received codes and residual carrier removal. The end product of the UMF GPS processor 14 shall be the generation of correlation summations over contiguous blocks of 10230 P-code chip intervals of de-spread punctual and early-late samples for the inphase and quadrature rails.

The GPS 14 function is preferably controlled via commands interpreted and data parameters disseminated by the UMF input controller 22 over the input controller bus 36. Results are made available via a sixteen bit tri-state output router bus 38. The input command and reset generation interface handles all address decoding and protocol required to interface to the UMF input controller bus 36. In addition, the reset generation logic performs the fine time resolution operations required to bring the GPS 14 function out of reset and into the active mode repeatable to within ± one clock cycle. The AOC and A/D command interfaces send commands to the AOC and A/D command ports, respectively.

The GPS PN generator port controller handles all protocol conversion between the Input command interface and the GPS PN generator command port. This controller provides facility to write commands to and receiver status from the PN generator. The AGC sampler receives as data input the inphase and quadrature odd rails from the wideband A/D interface 40.

A phase rotator receives the punctual and early-late inphase and quadrature data streams and rotates the I and Q pairs by the value produced at the carrier NCO. In addition, the PN code received from the PN generator is applied to the data. The output of the phase rotator is, therefore, complex phase-corrected and PN de-spread. The data is scaled in four integrate and dumps. The output Router interface 38 generates the protocol required by the output router 24. It sends a data block ready signal indicating that a particular output message is available. It then receives an address and port enable signal, decodes them, and makes available output data to the output router 24.

The input controller interface 36 provides facility for the IC 22 to communicate with the GPS narrowband chip. This communication consists of command and data parameters transmitted by the IC 22. Both the GPS 14 and narrowband 16 processors share this interface 36.

The foregoing discussion discloses and describes merely exemplary embodiments of the present invention. One having skill in the art will readily recognize from such discussion, and from the accompanying claims, that various changes and modifications may be made therein without departing from the spirit and scope of the invention as defined in the following claims.

We claim:

1. An avionic communication system for receiving and processing radio frequency signals, said signals being characterized as pulsed, minimum shift keying (MSK), narrowband and global positioning system (GPS) signal types, said communication system comprising:

front end receiver means for receiving pulsed, minimum shift keying (MSK), narrowband and global positioning system (GPS) signal types;

selection means for selecting one of said signal types received by said front end receiver means for processing;

pulse processor means for processing said pulsed signals and inhibiting said minimum shift keying (MSK), narrowband and global positioning system (GPS), signal types received by said front end receiver means;

minimum shift keying (MSK) processor means for processing said minimum shift keying (MSK) signals and inhibiting said pulsed, narrowband and global positioning system (GPS) signal types received by said front end receiver means;

narrowband processor means for processing said narrowband signals and inhibiting said pulsed, minimum shift keying (MSK) and global positioning system (GPS) signal types received by said front end receiver means;

global positioning system (GPS) processor means for processing said global positioning system (GPS) signals and inhibiting said pulsed, minimum shift keying (MSK) and narrowband signal types received by said front end receiver means; and interface means for directing said pulsed, minimum shift keying (MSK), narrowband and global positioning system (GPS) signal types received by said front end receiver means to each of said processor means for processing.

2. The avionic communication system as defined in claim 1 wherein said processor means are implemented as integrated circuits.

3. The avionic communication system as defined in claim 1 wherein said front end receiver means is a front end receiver, said front end receiver downconverts, demodulates and digitizes the pulsed, minimum shift keying (MSK), narrowband and global positioning system (GPS) signal types.

4. The avionic communication system as defined in claim 1 wherein said selection means for selecting one of said single types for processing is an input controller.

5. The avionic communication system as defined in claim 1 wherein said pulse processor means is a pulse processor, said pulse processor adapted to operate in various system modes selected from the group consisting of Mark XII Transpond, Mark XII Interrogator, tactical air communication and navigation (TACAN). Transpond, tactical air communication and navigation (TACAN). Interrogator and air traffic control radar beacon system (ATCRBS)/Mode S Transpond.

6. The avionic communication systems as defined in claim 1 wherein said minimum shift keying (MSK) processor means is a minimum shift keying (MSK) input processor and a minimum shift keying (MSK) output processor, said processors adapted to operate in various system modes selected from the group consisting of joint tactical information distribution system (J-TIDS) acquisition, circular code shift key (CCSK) demodulation, enhanced precision location report system user unit (EPUU) acquisition, and enhanced precision location report system user unit (EPUU) demodulation.

7. The avionic communication system as defined in claim 1 wherein said narrowband processor means is a narrowband processor, said narrowband processor adapted to directly receive said pulsed, minimum shift keying (MSK) narrowband and global positioning system (GPS) signal types from said front end receiver means.

8. The avionic communication system as defined in claim 1 wherein the global positioning system (GPS) processor means is a global positioning system (GPS) processor.

9. The avionic communication system as defined in claim 1 wherein said interface means includes a wideband analog to digital (A/D) interface.

10. The avionic communication system as defined in claim 1 further comprising a maintenance node connected to each of said processor means for interfacing and communicating with a maintenance processor to provide test capability for the avionic communication system.

11. A universal matched filter for receiving and processing signals, said signals being characterized as pulsed, minimum shift keying (MSK), narrowband and global positioning system (GPS) signal types, said filter comprising:

a wideband digital I and Q bus and a narrowband digital I and Q bus, said wideband and narrowband buses operable for receiving digital data from the pulsed, minimum shift keying (MSK), narrowband and global positioning system (GPS) signal types;

a wideband analog to digital (A/D) interface for receiving the digital data from the wideband digital I and Q bus;

narrowband processor means for receiving the digital data from the narrowband digital I and Q bus, said narrowband processor means processes the narrowband signals from the digital data and inhibits the pulsed, minimum shift keying (MSK) and global positional system (GPS) signal types;

pulsed processor means for receiving the digital data from the wideband analog to digital (A/D) interface, said pulsed processor means processes the pulsed signals from the digital data and inhibits the minimum shift keying (MSK), narrowband and global positioning system (GPS) signal types;

minimum shift keying (MSK) processor means for receiving the digital data from the wideband analog to digital (A/D) interface, said minimum shift keying (MSK) processor means processes said minimum shift keying (MSK) signals from the digital data and inhibits the pulsed, narrowband and global positioning system (GPS) signal types;

global positioning system (GPS) processor means for receiving the digital data from the wideband analog to digital (A/D) interface, said global positioning system (GPS) processor means processes the global positioning system (GPS) signals from the digital data and inhibits the pulsed, minimum shift keying (MSK) and narrowband signal types; and controller interface means connected to each of said processor means for receiving control signals from an input controller to select one of said signal types for processing.

12. The universal matched filter as defined in claim 11 further comprising a maintenance node connected to each of said processor means for interfacing and communicating with a maintenance processor to provide test capability for the universal matched filter.

13. The universal matched filter as defined in claim 11 wherein said controller interface means interfaces with an input controller, said input controller selecting one of said signal types for processing.

14. The universal matched filter as defined in claim 11 wherein said wideband digital I and Q bus and said narrowband digital I and Q bus receives said digital data from a front end receiver, said front end receiver operable for receiving the pulsed, minimum shift keying (MSK), narrowband and global positioning system (GPS) signal types.

15. An avionic communication system for receiving and processing signals, said signals being characterized as pulsed, minimum shift keying (MSK), narrowband and global positioning system (GPS) signal types, said communication system comprising:

a front end receiver operable for downconverting, demodulating and digitizing the pulsed, minimum shift keying (MSK), narrowband and global positioning system (GPS) signal types;

input controller for selecting one of said signal types received by said front end receiver for processing;

pulse processor for processing said pulsed signals from said front end receiver and inhibiting said minimum shift keying (MSK), narrowband and global positioning system (GPS) signal types;

minimum shift keying (MSK) processor for processing said minimum shift keying (MSK) signals from said front end receiver and inhibiting said pulsed, narrowband and global positioning system (GPS) signal types;

narrowband processor for processing said narrowband signals from said front end receiver and inhibiting said pulsed, minimum shift keying (MSK) and global positioning system (GPS) signal types;

global positioning system (GPS) processor means for processing said global positioning system (GPS) signals from said front end receiver and inhibiting said pulsed, minimum shift keying (MSK) and narrowband signal types;

wideband analog to digital (A/D) interface for directing said pulsed, minimum shift keying (MSK), narrowband and global positioning system (GPS) signal types to said pulse processor, said minimum shift keying (MSK) processor and said global positioning system (GPS) processor; and a maintenance node connected to each of said processors for interfacing and communicating with a maintenance processor to provide test capability for the avionic communication system.

* * * * *